United States Patent
Ushida et al.

Patent Number: 5,616,363
Date of Patent: Apr. 1, 1997

[54] LAMINATE, GLASS FIBER NON-WOVEN FABRIC THEREFOR AND A METHOD OF PRODUCING GLASS FIBER NON-WOVEN FABRIC

[75] Inventors: Masayuki Ushida, Anzyo; Masayuki Noda, Hikone; Masaru Ogata, Shiga-ken, all of Japan

[73] Assignee: Shin-Kobe Electric Machinery Co., Ltd., Tokyo, Japan

[21] Appl. No.: 289,243

[22] Filed: Aug. 11, 1994

[51] Int. Cl.$^6$ .............................. B05D 3/02; B32B 27/00; B32B 27/04

[52] U.S. Cl. .................. 427/372.2; 427/375; 427/379; 427/384; 427/386; 427/389.7; 427/389.8; 428/414; 428/420

[58] Field of Search ..................... 428/289, 414, 428/420; 427/372.2, 375, 379, 384, 386, 389.7, 389.8

[56] References Cited

PUBLICATIONS

Modein Plastics Encyclopedia, Payes 140–143, 1990.

*Primary Examiner*—Patrick Ryan
*Assistant Examiner*—R. C. Weisberger
*Attorney, Agent, or Firm*—Pearne, -Gordon, McCoy & Granger

[57] ABSTRACT

Glass fiber non-woven fabric for base material of laminate comprising binder binding glass fibers to each other and having glass transition temperature of higher than 120° C.

5 Claims, 2 Drawing Sheets

LAMINATE, GLASS FIBER NON-WOVEN FABRIC THEREFOR AND A METHOD OF PRODUCING GLASS FIBER NON-WOVEN FABRIC

BACKGROUND OF THE INVENTION

This invention pertains to laminate, glass fiber non-woven fabric for base material of laminate and a method of producing the glass fiber non-woven fabric.

Glass non-woven fabric has been conventionally used for base material of electrically insulating laminate. The laminate has been produced by impregnating the base material with thermosetting resin and forming them under heat and under pressure. The glass non-woven fabric before impregnated with thermosetting resin has glass fibers bound by binder to each other.

The binder has been conventionally produced as disclosed in Japanese patent Application Publication No. 39474/1977, for example. In this Publication, 1,2 epoxide compound having more than two oxilane functions included in a molecule and having epoxy equivalent of 170 through 1000 is reacted with water-soluble polyamine compound having more than at least one active hydrogen bound with nitrogen atom at a ratio of more than ¼ of the active hydrogen in the water-soluble polyamine compound relative to one oxylane function in the epoxide compound. The thus obtained product has an acid added thereto to induce water-soluble or water-dispersed amine-epoxide acid salt which is quickly cured under heat.

The disclosed binder has glass transition temperature of about 95° C. and is produced by using 40 weight parts of solvent in order to improve a control of reaction progress.

However, thermosetting resin laminate having base material of glass fiber non-woven fabric produced by binding glass fibers to each other by the conventional binder tends to have contraction in size produced while the laminate is processed under heat.

In addition thereto, a large quantity of solvent has to be used for producing the conventional binder.

SUMMARY OFT HE INVENTION

A principal object of the invention is to provide a thermosetting resin laminate having glass fiber non-woven fabric adapted to be prevented from having contraction in size produced therein.

Another object of the invention is to provide glass fiber non-woven fabric adapted to be prevented from having contraction in size produced therein.

Further object of the invention is to provide a method of producing glass fiber non-woven fabric adapted to be prevented from having contraction in size produced therein.

Further object of the invention is to provide a method of producing glass fiber non-woven fabric adapted to obtain binder therefor while a smaller amount of solvent is used.

In accordance with one aspect of the invention, there is provided a laminate comprising base material impregnated with thermosetting resin and formed under heat and under pressure, at least one portion of said base material comprising glass fiber non-woven fabric having glass fibers bound to each other by binder having glass transition temperature of higher than 120° C.

In accordance with another aspect of the invention, there is provided glass fiber non-woven fabric for a laminate having glass fibers bound to each other by binder having glass transition temperature of higher than 120° C.

In accordance with further aspect of the invention, there is provided a method of producing glass fiber non-woven fabric having glass fibers bound to each other by binder comprising a reactant of epoxy resin and aliphatic amine having an acid added thereto, said method characterized by using as said epoxy resin bifunctional epoxy resin which is liquid at ordinary temperature and epoxy resin of polyfunction of more than tetra-function, said two kinds of epoxy resin being reacted with said aliphatic amine and having said acid added thereto.

In accordance with further aspect of the invention, there is provided a method of producing glass fiber non-woven fabric having glass fibers bound to each other by binder comprising a reactant of epoxy resin and aliphatic amine having an acid added thereto, said method characterized by using as said epoxy resin tri-functional epoxy resin and epoxy resin of poly-function of more than tetra-function, said two kinds of epoxy resin being reacted with said aliphatic amine and having said acid added thereto.

In accordance with further aspect of the invention, there is provided a method of producing glass fiber non-woven fabric having glass fibers bound to each other by binder comprising a reactant of epoxy resin and aliphatic amine having an acid added thereto, said method characterized by using tri-functional epoxy resin as said epoxy resin, said epoxy resin being reacted with said aliphatic amine and having said acid added thereto.

Since the binder for the glass fiber non-woven fabric of the invention binding glass fibers to each other have the glass transition temperature higher than the conventional binders, they are never softened when the laminate produced by using the glass fiber non-woven fabric of the invention is formed under heat and under pressure even though the thermosetting resin with which the glass fiber non-woven fabric is impregnated is molten and softened. Thus, the binder never moves together with the molten resin so that it is never extended and broken with the result that the laminate is restrained from having contraction in size produced therein.

It should be noted that the glass transition temperature of the binder for the glass fiber non-woven fabric is essentially higher than 120° C. (including 120° C.) for restraining the laminate from being contracted in size because curing reaction of the molten thermosetting resin is rapidly progressed as the forming temperature of the laminate is raised until it reaches 120° C. and has a higher viscosity so that it is no longer fluid.

In this manner, since glass fibers are kept to be bound to each other until the thermosetting resin is cured and no longer fluid, the binder can accomplish its function.

As the glass transition temperature of the binder exceeds 120° C., the laminate can be prevented from being more positively contracted in size. Although the thermosetting resin is cured and less fluid, it will expand and slightly move due to its formation pressure. As the glass transition temperature of the binder becomes higher and higher, the glass fibers of the glass fiber non-woven fabric can be positively bound to each other by the binder against the movement of the thermosetting resin due to its expansion.

Since the bi-functional epoxy resin which has lower relative reaction functions as reactive dilution agent for poly-functional epoxy resin which is epoxy resin of more than tri-function and which has higher relative reaction, the progress of the reaction can be controlled even though the quantity of solvent for reaction system is reduced.

Since the reaction of the tri-functional epoxy resin with the aliphatic amine is nearly that of the bi-functional epoxy resin, the quantity of solvent can be reduced when a single system of only the tri-functional epoxy resin is used.

When both of the tri-functional epoxy resin and epoxy resin of more than tetra-function are used, the quantity of solvent can be also reduced because the former serves as reactive dilution agent for the latter.

BRIEF DESCRIPTION OF THE DRAWINGS

The above and other objects and features of the invention will be apparent from the description of the embodiments of the invention taken along with reference to the accompanying drawings in which.

DETAILED DESCRIPTION OF THE EMBODIMENTS

Figure 1:
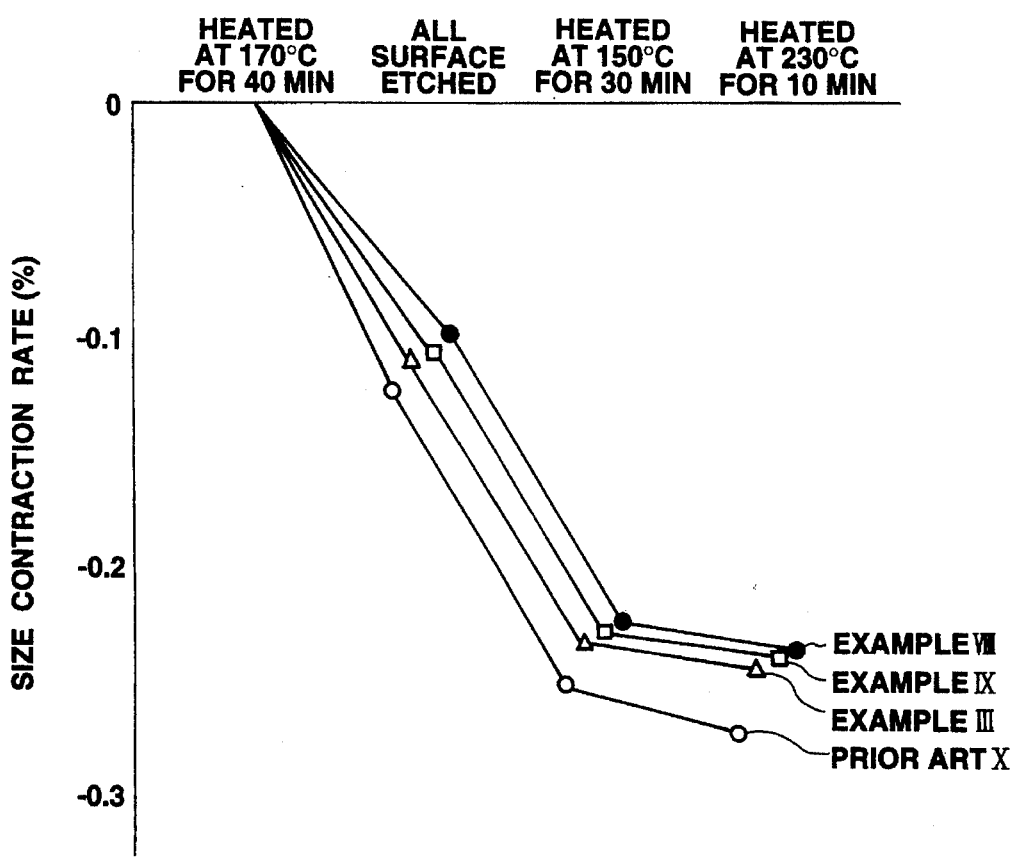
FIG. 1 illustrates variations in size contraction ratio while laminates are processed in various manners.

As aforementioned, laminates of the invention comprise base material impregnated with thermosetting resin and formed under heat and under pressure. At least one portion of the base material comprises glass fiber non-woven fabric having glass fibers bound to each other by binder having glass transition temperature of higher than 120° C. (including 120° C.).

The binder comprises a reactant of epoxy resin and aliphatic amine having an acid added thereto. Epoxy resin used for the invention may be combination of bi-functional epoxy resin which is liquid at ordinary temperature and epoxy resin of poly-function of more than tetra-function. The two kinds of epoxy resin are reacted with aliphatic amine and have acid added thereto.

Otherwise, epoxy resin may be combination of tri-functional epoxy resin and epoxy resin of poly-function of more than tetra-function. The two kinds of epoxy resin are reacted with aliphatic amine and have acid added thereto.

Alternatively epoxy resin may be tri-functional epoxy resin, which is reacted with aliphatic amine and has acid added thereto.

Bi-functional epoxy resin which is to be used for the invention and which is fluid at ordinary temperature may be bis-phenol A type epoxy resin while poly-functional epoxy resin including tri-functional epoxy resin may be phenol-novolac-epoxy resin, cresol-novolac epoxy resin, his-phenol A type novolac epoxy resin and the like.

Amine for curing agent may be water-soluble polyamine of straight chain aliphatic amine such as diethylene-triamine and triethylene-tetramine, but it is not limited thereto.

Solvent for controlling the reaction may be of any type except for alcohol such as methanol which is reactive with epoxy resin.

Acid for neutralizing aliphatic amine may be organic acid such as formic acid and acetic acid having no harm to human body during drying step while the glass fiber non-woven fabric is produced, but it will be understood that it is not limited thereto.

(LAMINATE AND GLASS FIBER NON-WOVEN FABRIC)

As shown in Table I, there were prepared various glass fiber non-woven fabrics I through XII having binders of various glass transition temperatures $Tg$ used therefor. In this table, "GBNF" means glass fiber non-woven fabric while "Tg" means glass transition temperature (°C.), which was measured by thermal mechanical analyzer (TMA method). The above binders used in the glass fiber non-woven fabrics I through XII were produced by Examples, Comparisons and Prior Art I through XII described later with respect to production of glass fiber non-woven fabrics.

TABLE I

| GBNF | I | II | III | IV | V |
|---|---|---|---|---|---|
| Tg | 125 | 135 | 122 | 135 | 140 |
| GBNF | VI | VII | VIII | IX | X |
| Tg | 145 | 152 | 205 | 143 | 96 |
| GBNF | | XI | | XII | |
| TG | | 165 | | 200 | |

Prepregs were produced by impregnating these glass fiber non-woven fabrics with epoxy resin and drying them. Thereafter, copper foils were placed on both sides of the two prepregs superposed one upon another and formed under heat and under pressure to produce laminates.

It was found that the thus produced laminates have had such size-contraction rate during their working process as varied as shown in FIG. 1.

Figure 2:
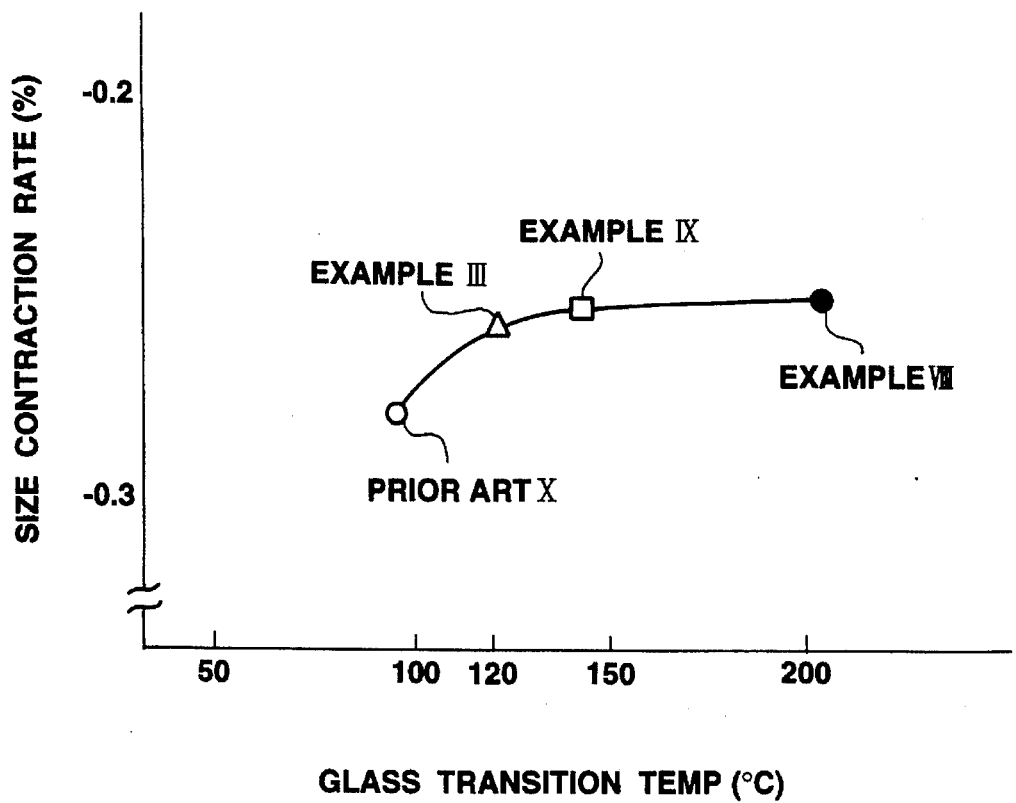
FIG. 2 illustrates relationship of glass transition temperature of binder for glass fiber non-woven fabric with size contraction of the laminates having the glass fiber non-woven fabrics used therein.

It was also found that the laminates have had variation in size-contraction rate of FIG. 1 after their final thermal working process relative to the glass transition temperature $Tg$ as shown in FIG. 2.

It will be noted from FIG. 1 that as the glass transition temperature $Tg$ of the binders raises, the size-contraction rate of the laminates is reduced. It will be also noted from FIG. 2 that the size-contraction rate of the laminates is more remarkably and more effectively reduced at the glass transition temperature of higher than 120° C.

Glass fiber non-woven fabrics were produced by papermaking glass fibers and spraying binders thereto, which will be described in detail. In Examples of the invention, Comparison and Prior Art, epoxy resin selected from ones shown in TABLE II was used, penta-ethylene-hexamine was used as aliphatic amine, acetone as organic solvent and acetic acid as reaction termination agent. In these Examples, Comparisons and Prior Art, all of active hydrogen equivalent ratio of amine/epoxy resin was 1. In table II, Maker "A" is YUKA SHELL Co. LTD., Japan, "B" TOHTO KASEI Co. LTD., Japan and "C" MITSUI OIL CHEMICAL Co. Ltd., Japan.

TABLE II

| Tradename | Type of epoxy resin | maker |
|---|---|---|
| EPIKOTE 828 | bis-phenol A type bi-functional | A |
| EPIKOTE 157S70 | bis-phenol A novolac type poly-functional | A |
| EPIKOTE 1032 | glycygylized tris-phenylole methane type tri-functional | A |

TABLE II-continued

| Tradename | Type of epoxy resin | maker |
|---|---|---|
| YDPN-638 | phenol novolac poly-functional | B |
| YDCN-704 | cresol novolac poly-functional | B |
| VG 3101 | glycygylized tris-phenylole methane type tri-functional | C |

EXAMPLE I

To 50 weight parts of EPIOKTE 828, 50 weight parts of YDPN-638 (Table II) and 13.2 weight parts of triethylene tetramine was added and combined 37.7 weight parts of acetone. Then, they were reacted with each other at ordinary temperature for eight hours while fully agitated and thereafter have 1019 weight parts of 10% acetic acid aqueous solution added thereto to produce binder for glass fiber non-woven fabric.

EXAMPLE II

To 100 weight parts of YDPN-638 (Table II) and 13.6 weight parts of triethylene tetramine was added and combined 61.2 weight parts of acetone. Then, they were reacted with each other at ordinary temperature for eight hours while fully agitated and thereafter have 1022 weight parts of 10% acetic acid aqueous solution added thereto to produce binder for glass fiber non-woven fabric.

EXAMPLE III

To 70 weight parts of EPIOKTE 828 (Table II), 30 weight parts of YDCN-704 (Table II) and 12.4 weight parts of triethylene tetramine was added 28 weight parts of acetone. Then, they were reacted with each other at ordinary temperature for eight hours while fully agitated and combined and thereafter have 1012 weight parts of 10% acetic acid aqueous solution added thereto to produce binder for glass fiber non-woven fabric.

EXAMPLE IV

To 50 weight parts of EPIOKTE 828 9 (Table II), 50 weight parts of YDCN-704 and 12.1 weight parts of triethylene tetramine was added 45 weight parts of acetone. Then, they were reacted with each other at ordinary temperature for eight hours while fully agitated and combined thereafter have 1009 weight parts of 10% acetic acid aqueous solution added thereto to produce binder for glass fiber non-woven fabric. (EXAMPLE V)

To 30 weight parts of EPIOKTE 828 (Table II), 70 weight parts of YDGN-704 (Table II) and 11.8 weight parts of triethylene tetramine was added 60.2 weight parts of acetone. Then, they were reacted with each other at ordinary temperature for eight hours while fully agitated and combined and thereafter have 1006 weight parts of 10% acetic acid aqueous solution added thereto to produce binder for glass fiber non-woven fabric.

EXAMPLE VI

To 100 weight parts of YDCN-704 (Table II) and 11.3 weight parts of triethylene tetramine was added 74.2 weight parts of acetone. Then, they were reacted with each other at ordinary temperature for eight hours while fully agitated and combined and thereafter have 1002 weight parts of 10% acetic acid aqueous solution added thereto to produce binder for glass fiber non-woven fabric.

EXAMPLE VII

To 50 weight parts of EPIOKTE 828, (Table II) 50 weight parts of VG 3101 and 12.2 weight parts of triethylene tetramine was added 28 weight parts of acetone. Then, they were reacted with each other at ordinary temperature for eight hours while fully agitated and combined and thereafter have 1010 weight parts of 10% acetic acid aqueous solution added thereto to produce binder for glass fiber non-woven fabric.

EXAMPLE VIII

To 100 weight parts of VG 3101 (Table II) and 11.6 weight parts of triethylene tetramine was added 48 weight parts of acetone. Then, they were reacted with each other at ordinary temperature for eight hours while fully agitated and combined and thereafter have 1004 weight parts of 10% acetic acid aqueous solution added thereto to produce binder for glass fiber non-woven fabric.

EXAMPLE IX

To 100 weight parts of EPIKOTE 157S70 (Table II) and 11.8 weight parts of triethylene tetramine was added 74.5 weight parts of acetone. Then, they were reacted with each other at ordinary temperature for eight hours while fully agitated and combined and thereafter have 1006 weight parts of 10% acetic acid aqueous solution added thereto top produce binder for glass fiber non-woven fabric.

PRIOR ART X

To 100 weight parts of EPIKOTE 828 (Table II) and 15.3 weight parts of pentaethylene hexamine was added 99.4 weight parts of acetone. Then, they were reacted with each other at a temperature of 60° C. for three hours while fully agitated and combined and thereafter have 1038 weight parts of 10% acetic acid aqueous solution added thereto to produce binder for glass fiber non-woven fabric.

EXAMPLE XI

To 70 weight parts of EPIKOTE 157S70 (Table II), 30 weight parts of EPIKOTE 1032 (Table II) and 12.8 weight parts of triethylene tetramine was added 48.4 weight parts of acetone. Then, they were reacted with each other at ordinary temperature for three hours while fully agitated and combined and thereafter have 1015 weight parts of 10% acetic acid aqueous solution added thereto to produce binder for glass fiber non-woven fabric.

EXAMPLE XII

To 100 weight parts of EPIKOTE 1032 (Table II) and 14.9 weight parts of triethylene tetramine was added 49.2 weight parts of acetone. Then, they were reacted with each other at ordinary temperature for three hours while fully agitated and combined and thereafter have 1034 weight parts of 10% acetic acid aqueous solution added thereto to produce binder for glass fiber non-woven fabric.

In these Examples, Comparisons and Prior Art, the rate of solvent relative to reactant solution was shown in TABLE III. This Table has glass transition temperature of the thus obtained binders also indicated thereon. Examples I, III through V, VII and VIII, Comparisons II, VI and IX, and Prior Art X correspond to those in Table I.

TABLE III

|  | I | II | III | IV | V |
| --- | --- | --- | --- | --- | --- |
| Solvent (weight parts) | 25 | 35 | 20 | 30 | 35 |
| TG °C. | 125 | 135 | 122 | 135 | 140 |
|  | VI | VII | VIII | IX | X |
| Solvent (weight parts) | 40 | 20 | 30 | 40 | 46 |
| TG °C. | 145 | 152 | 205 | 143 | 96 |
|  |  |  | XI | XII |  |
| Solvent (weight parts) |  |  | 30 | 30 |  |
| Tg °C. |  |  | 165 | 200 |  |

It will be noted from Table III that according to Examples I, III through V, VII and VIII of the invention, there were produced binders having glass transition temperature of more than 120° C. while the reaction was controlled having a smaller amount of solvent used therefor, which advantageously causes the amount of solvent to be saved.

Although some examples of the invention have been illustrated and described with reference to the accompanying drawings, it will be understood that they are by way of examples and that various changes and modifications may be made without departing from the spirit and scope of the invention, which is defined only by the appended claims.

What is claimed is:

1. A method of producing a laminate including a non-woven fabric formed of glass fibers and impregnated with a thermosetting resin, said thermosetting resin having a softening temperature and being heated to at least its softening temperature during the formation of the laminate, comprising the steps of forming a binder for said glass fibers by reacting epoxy resin and aliphatic amine having an acid added thereto, selecting said epoxy resin to provide said binder with a glass transition temperature of at least 120° C. and greater than the softening temperature of said thermosetting resin, applying said binder to said glass fibers and curing said binder to bind said glass fibers to each other prior to impregnation with said thermosetting resin, impregnating said fabric with said thermosetting resin, shaping said impregnated fabric with heating of said thermosetting resin to at least its softening temperature, and curing said thermosetting resin to form said laminate, whereby said binder tends to resist movement of said glass fibers as the softened resin is shaped and to restrain contraction of the cured laminate.

2. The method of claim 1, wherein the step of forming said binder includes using a bi-functional epoxy resin which is liquid at ordinary temperature and an epoxy resin of poly-function of more than tetra-function, and reacting said two kinds of epoxy resin with said aliphatic amine and adding said acid thereto.

3. The method of claim 1, wherein the step of forming said binder also includes using a tri-functional epoxy resin and an epoxy resin of poly-function of more than tetra-function, and reacting said two kinds of epoxy resin with said aliphatic amine and adding said acid thereto.

4. A method of producing a laminate including a non-woven fabric formed of glass fibers and impregnated with a thermosetting resin, said thermosetting resin having a softening temperature and being heated to at least its softening temperature during the formation of the laminate, comprising the steps of forming a binder for said glass fibers by reacting epoxy resin and aliphatic amine having an acid added thereto, selecting a tri-functional epoxy resin as said epoxy resin to provide said binder with a glass transition temperature of at least 120° C. and greater than the softening temperature of said thermosetting resin, applying said binder to said glass fibers and curing said binder to bind said glass fibers to each other prior to impregnation with said thermosetting resin, impregnating said fabric with said thermosetting resin, shaping said impregnated fabric with heating of said thermosetting resin to at least its softening temperature, and curing said thermosetting resin to form said laminate, whereby said binder tends to resist movement of said glass fibers as the softened resin is shaped and to restrain contraction of the cured laminate.

5. A method of producing a laminate including a non-woven fabric formed of glass fibers and impregnated with a thermosetting resin, said thermosetting resin having a softening temperature and being heated to at least its softening temperature during formation of the laminate, comprising the steps of providing a binder for said fabric glass fibers by reacting epoxy resin and aliphatic amine having an acid added thereto, said epoxy resin being selected to provide said binder with a glass transition temperature of at least 120° C. and greater than the softening temperature of said thermosetting resin, applying said binder to said glass fibers and curing said binder to bind the glass fibers to each other prior to impregnation with said thermosetting resin, impregnating said fabric with said thermosetting resin, shaping said impregnated fabric with heating of said thermosetting resin to at least its softening temperature, and curing said thermosetting resin to form said laminate.

* * * * *